(12) United States Patent
Nakamura et al.

(10) Patent No.: US 6,184,056 B1
(45) Date of Patent: Feb. 6, 2001

(54) PROCESS FOR PRODUCING SOLAR CELLS AND SOLAR CELLS PRODUCED THEREBY

(75) Inventors: Kazuyo Nakamura; Keiji Shimada, both of Kitakatsuragi-gun (JP)

(73) Assignee: Sharp Kabushiki Kaisha, Osaka (JP)

( * ) Notice: Under 35 U.S.C. 154(b), the term of this patent shall be extended for 0 days.

(21) Appl. No.: 09/304,280

(22) Filed: May 3, 1999

(30) Foreign Application Priority Data

May 19, 1998 (JP) .................................................. 10-137032

(51) Int. Cl.[7] .................................................. H01L 21/00
(52) U.S. Cl. .................................................. 438/57; 257/447
(58) Field of Search .................................. 438/66, 48, 459, 438/977, FOR 485, 149, 30, 57, 257; 257/458, 461, 431

(56) References Cited

U.S. PATENT DOCUMENTS

| | | |
|---|---|---|
| 4,824,489 | 4/1989 | Cogan et al. . |
| 5,430,616 | * 7/1995 | Katsu et al. .......................... 361/809 |
| 5,472,885 | 12/1995 | Matsumo et al. . |
| 5,828,117 | * 10/1998 | Kondo et al. .......................... 257/458 |
| 5,972,732 | * 10/1999 | Gee et al. .......................... 438/66 |

FOREIGN PATENT DOCUMENTS

| | | |
|---|---|---|
| 0 474 349 A2 | 3/1992 | (EP) . |
| 63-261761 | 10/1988 | (JP) . |
| 2-001914 | 1/1990 | (JP) . |
| 2-202023 | 8/1990 | (JP) . |
| 3-044067 | 2/1991 | (JP) . |
| 3-050713 | 3/1991 | (JP) . |
| 4-091482 | 3/1992 | (JP) . |
| 8-274286 | 10/1996 | (JP) . |
| 89/05521 | 6/1989 | (WO) . |

* cited by examiner

*Primary Examiner*—Matthew Smith
*Assistant Examiner*—Calvin Lee
(74) *Attorney, Agent, or Firm*—Nixon & Vanderhye P.C.

(57) ABSTRACT

A process for producing a solar cell comprises the steps of; forming at least one electrode on a first surface of a semiconductor substrate for constructing a solar cell, attaching a support substrate to the first surface of the semiconductor substrate on which said electrode is formed, and then processing the semiconductor substrate into a thin-film semiconductor substrate.

11 Claims, 9 Drawing Sheets

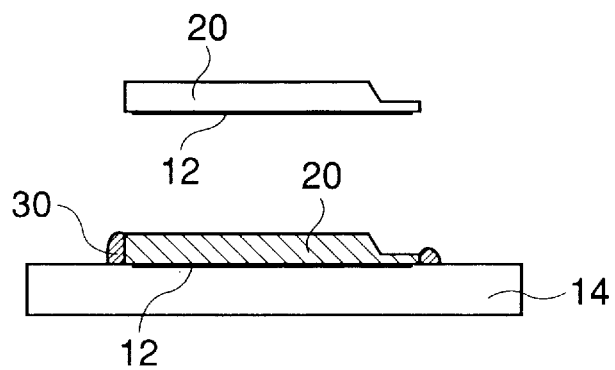
Fig. 6(a)
Fig. 6(b)
Fig. 6(c)
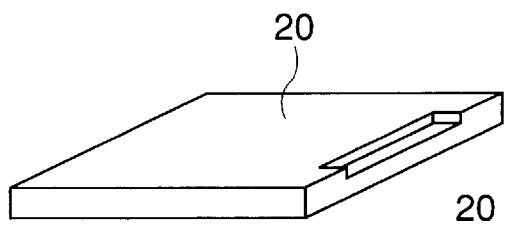
Fig. 7(a)
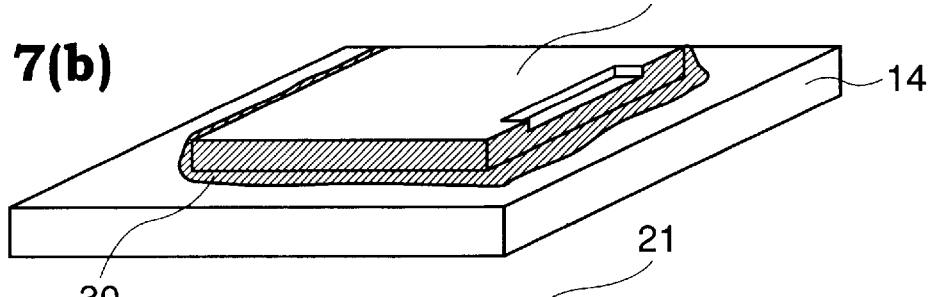
Fig. 7(b)
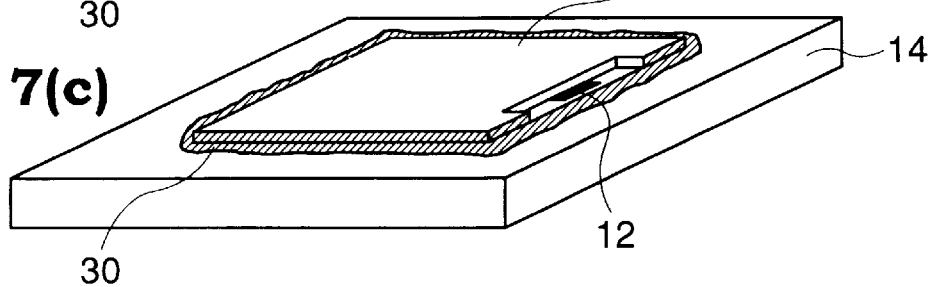
Fig. 7(c)

PROCESS FOR PRODUCING SOLAR CELLS AND SOLAR CELLS PRODUCED THEREBY

CROSS-REFERENCE TO RELATED APPLICATION

This application is related to Japanese application No. HEI 10(1998)-137032 filed on May 19, 1998, whose priority is claimed under 35 USC §119, the disclosure of which is incorporated by reference in its entirety.

BACKGROUND OF THE INVENTION

1. Field of the Invention

The present invention relates to a process for producing solar cells and solar cells produced thereby, and more particularly relates to a process for producing solar cells for use in outer space which can be borne by an artificial satellite and solar cells produced by the process.

2. Description of Related Art

In recent years, solar cells which can be used in outer space are under active development.

Solar cells in use in space are exposed to cosmic rays flying around in huge numbers. As a result, the solar cells deteriorate in properties including conversion efficiency with varying degrees of deterioration depending upon the kind of the solar cells. Accordingly, it is one of the most important challenges in development of space-use solar cells to realize the highest possible output for an final output (i.e., minimum output during their service) in view of irradiation doses in a use environment.

Typical space-use solar cells are produced by the following process:

First, as shown in FIG. 12(a), a semiconductor substrate 50 is used. The semiconductor substrate 50 is cut from an ingot of single-crystal silicon usually in the form of a wafer of about 300 $\mu$m thickness.

Next, as shown in FIG. 12(b), this substrate 50 is made into a thin-film silicon substrate 51 of about 100 to 200 $\mu$m thickness by etching with an aqueous acidic or alkali solution or by polishing. Subsequently, the thin-film silicon substrate 51 is washed a number of times. Then, p-type diffusion layers (not shown) are formed on one surface of the silicon substrate 51, for example, on a surface opposite to a photo-receptive face-to-be (i.e., on a non-photo-receptive face).

Subsequently, high-concentration n-type diffusion layers (not shown) are formed on the photo-receptive face. Thereafter, as shown in FIG. 12(c), an insulating film is partially removed, and n-electrodes 52 of Ag/Pd/Ti and p-electrodes (not shown) of Ag/Pd/Ti/Al are formed on the photo-receptive face and on the non-photo-receptive face, respectively.

Then, as shown in FIG. 12(d), the resulting substrate is separated into individual cells. Thus solar cells of single-crystal silicon are obtained.

Also solar cells in which both electrodes contact on a rear surface are well known. The solar cells of this type are produced by the following process:

First, a semiconductor substrate 50 as shown in FIG. 13(a) which is cut in the form of a wafer as in the above-described process is made into a thin-film silicon substrate 51 as illustrated in FIG. 13(b). Subsequently, the silicon substrate 51 is subjected to a number of washings.

Thereafter, on one surface of the silicon substrate 51, for example, on the non-photo-receptive face thereof, p-type diffusion layers and n-type diffusion layers are formed in the form of islands.

Then, as shown in FIG. 13(c), an insulating film is partially removed, and electrodes, for example, of Ag/Pd/Ti/Al are formed as p-electrodes 54 and n-electrodes 52 so as to come in contact with the island-like p-type and n-type diffusion layers, respectively.

Subsequently, as in the aforementioned process, the resulting substrate is divided into individual cells, as shown in FIG. 13(d). Thus solar cells of single-crystal silicon are obtained.

Generally, the thinner the substrate of a solar cell is, the less susceptible to the effect of cosmic rays the solar cell is.

However, in the case of a substrate of a crystalline semiconductor, the thinner the substrate is, the stronger the possibility of the substrate breaking during manufacture of solar cells becomes. Therefore, it is actually impossible to manufacture thin solar cells from a very thin substrate of a crystalline semiconductor. In a conventional technique, the marginal thickness of the substrate is about 100 $\mu$m. Furthermore, in this case, it is required to process an originally thick substrate into a substrate of about 100 $\mu$m thickness before entering the process of constructing a solar cell structure.

On the other hand, in the case where an amorphous semiconductor is used, it is possible to obtain very thin solar cells. This is because the amorphous semiconductor can usually be formed in extreme thin films on transparent substrates by CVD and the thin films can be used for the solar cells. In addition to that, the amorphous semiconductor can have relatively free band gaps, and accordingly is excellent in radiation resistance. However, the films of the amorphous semiconductor include lots of elements nucleating re-association of minority carriers such as in-gap levels and grain boundaries within the full area of the films, and the films of the amorphous semiconductor have a shorter diffusion length for carriers, which greatly affects the conversion efficiency of solar cells, compared with single-crystal silicon. Therefore, a high initial conversion efficiency cannot be expected unless a breakthrough technique is introduced to the thin films.

In contrast, with solar cells of crystalline materials typified by silicon, a high initial conversion efficiency before exposure to radiation can be realized. However, every crystalline material has its own fixed band gap. In addition to that, a thin substrate thereof is difficult to handle as described above. Therefore, it has been very hard to improve the radiation resistance of the solar cells of this type.

SUMMARY OF THE INVENTION

The present invention provides a process for producing a solar cell comprising the steps of forming at least one electrode on a first surface of a semiconductor substrate for constructing a solar cell, attaching a support substrate to the first surface of the semiconductor substrate on which said electrode is formed, and then processing the semiconductor substrate into a thin-film semiconductor substrate.

In another aspect, the invention provides a solar cell produced by the above-mentioned process.

These and other objects of the present application will become more readily apparent from the detailed description given hereinafter. However, it should be understood that the detailed description and specific examples, while indicating preferred embodiments of the invention, are given by way of illustration only, since various changes and modifications

BRIEF DESCRIPTION OF THE DRAWINGS

FIGS. 6(a) to 6(c) are schematic sectional views of a major part of a solar cell, illustrating another process for producing a solar cell in accordance with the present invention;

FIGS. 7(a) to 7(c) are top perspective views illustrating the process, these figures corresponding to FIGS. 6(a) to 6(c);

DESCRIPTION OF THE PREFERRED EMBODIMENTS

Figure 1A:
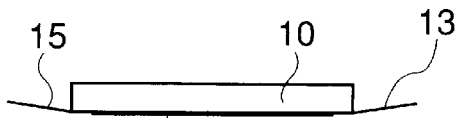
FIGS. 1(a) to 1(c) are schematic sectional views of a major part of a solar cell, illustrating a process for producing a solar cell in accordance with the present invention.

As the semiconductor substrate for constructing the solar cell, any substrate of a semiconductor which is usually used for constructing a solar cell may be used. Examples of such substrates include silicon and germanium, and compound semiconductors such as GaAs, InGaAs and InPGaAs, among which silicon is preferred. The semiconductor substrate may be of a single-crystal semiconductor or of a polycrystalline semiconductor, or of single crystals or polycrystals obtained by crystallizing an amorphous semiconductor.

The size of the semiconductor substrate may be adjusted as appropriate depending on functions and properties of the solar cell for which the semiconductor substrate is used. For example, the semiconductor substrate may be in a substantially rectangular shape of about 20 to 150×20 to 150 mm. The thickness of the semiconductor substrate is not particularly limited as long as substrate may be placed on and attached to the support substrate described in detail below and may be processed, but may be 100 to 800 $\mu$m, for example.

In the present invention, in order to construct the solar cell from the above-described semiconductor substrate, it is preferable to form a p-type diffusion layer and an n-type diffusion layer, and a p-electrode and an n-electrode which are connected to these diffusion layers, respectively, on a first surface of the semiconductor substrate, or alternatively to form either a combination of the p-type diffusion layer with the p-electrode or a combination of the n-type diffusion layer with the n-electrode on the first surface of the semiconductor substrate. In these cases, the first surface on which the diffusion layer(s) and electrode(s) are formed may be an adhesion face to a support substrate.

The p- and n-electrodes may be formed of electrically conductive materials usable for ordinary electrodes, including, for examples, electrically conductive transparent materials such as ZnO, $SnO_2$ and ITO, metal materials such as gold, platinum, silver, copper, aluminum, lead, titanium, palladium, tantalum, tungsten and molybdenum, and a laminate of such materials. The electrodes may be formed by a known process such as a sputtering process, a CVD process or an electron-beam deposition process, and patterned into a desired configuration by a photolithography and etching process or a lift-off process. The thickness of the electrodes is not particularly limited and may be about 2 to 20 $\mu$m, for example.

On the photo-receptive face, since electrodes cast shadows of their areas in incident light, it is preferable that the p- and n-electrodes have a small area. However, the electrodes are preferably so configured that electric current is obtained from the entire surface of the cell. An exemplary configuration which satisfies these contradictory requirements may be the shape of a comb. On the non-photo-receptive face, the configuration of electrodes is not particularly limited as long as the electrodes has a thickness enough to obtain a proper electric resistance and a configuration to cover the entire surface of the cell.

In the case where both the p- and n-electrodes are formed on one surface (preferably on the non-photo-receptive face), no electrodes are required to be formed on the photo-receptive face. Accordingly the shadows of electrodes do not exist in the incident light. Consequently, the photo-receptive area substantially increases, and therefore the conversion efficiency can be improved depending on the design of devices.

The p-type and n-type diffusion layers may be formed by a known process, for example, by ion implantation with use of a resist mask which has an opening in a desired region, by thermal diffusion or the like. Impurities for the p-type diffusion layer may be boron, and impurities for the n-type diffusion layer may be arsenic or phosphorus. The concentration of the impurities is about $10^{18}$ to $10^{21}$ $cm^{-3}$, for example.

Generally, the higher the concentration of impurities in the diffusion layers is, the shorter the lifetime of minority carriers becomes. Accordingly, it is more preferable that the p-type and n-type diffusion layers have smaller areas. On the other hand, the carriers must be collected effectively. Consequently, the diffusion layers preferably have such a configuration that the diffusion layers have reduced areas while at the same time the diffusion layers have effect on the entire cell region. For example, the diffusion layers may be in the form of islands.

The support substrate is not particularly limited to any type, and any substrate that is usually used as a substrate may be used. Examples of the support substrate include the ones having transparency to light, the ones having the function of a protective film, especially the ones having the function of a cover glass for a space-use solar cell and the ones having other functions. Examples thereof include substrates of various materials including substrates of glass, graphite, metals such as stainless steel, aluminum and iron, and substrates of resins such as polyimide and polyvinyl, substrates of metals coated with resins, and substrates of resins with metal layers formed thereon. The support substrate may be formed in conjunction with an insulating film, an electrically conductive film or a wiring layer of a metal or a semiconductor, a buffer layer or a combination thereof, depending on how the support substrate is utilized. The thickness of the support substrate is not particularly limited, but may be about 50 to 500 $\mu$m so that the support substrate has a suitable strength and weight.

The semiconductor substrate may be attached to the support substrate, for example, by placing the semiconductor substrate on the support substrate with intervention of an adhesive, an adhesive tape or the like and subsequently pressing them with an appropriate pressure. As regards the adhesive used here, a suitable adhesive may be selected, taking into account the adhesion to the semiconductor material for the semiconductor substrate and to the material for the support substrate. Examples of suitable adhesives may be resin based adhesives made of acrylic resins, polyethylene resins, polyvinyl chloride resins, phenol resins, melamine resins, epoxy resins, polyurethane resins and the like, elastomeric adhesives made of natural rubbers, styrene butadiene rubbers, silicone elastomers and the like, and other adhesives, among which the resin based adhesives are preferred. As the adhesive tape, various adhesive tapes including textile tapes, paper tapes, film tapes, nonwoven tapes, foam tapes and the like may be used. The pressure applied to the semiconductor substrate places on the support substrate may be adjusted as required depending on the type of the adhesive or adhesive tape used and the type of the semiconductor substrate and the support substrate.

As process of making the semiconductor substrate attached on the support substrate into a thin-film semiconductor substrate may be selected as appropriate taking into consideration the material for the support substrate, materials for electrodes and interconnectors as described below, the properties of the adhesive and the like. Examples of such processes may be polishing by a chemical mechanical polishing (CMP) process, wet etching with an acid or alkali solution, and the like. Examples of acid solutions usable for etching may be hydrochloric acid, sulfuric acid, nitric acid, hydrofluoric acid, acetic acid, formic acid and the like, which may be used singly or as a mixture of two or more thereof. Examples of alkali solutions usable for etching may be sodium hydroxide, ammonia, potassium hydroxide, calcium hydroxide and the like, which may be used singly or as a mixture of two or more thereof. Among these solutions, it is preferable to use alkali solutions such as sodium hydroxide, potassium hydroxide and the like, which are less likely to affect the support substrate, the adhesive and the like. These alkali solutions may be used in a concentration of about one wt % to 50 wt % and the acid solutions may be used in a concentration of about 5 wt % to 50 wt %. In addition, these solutions may be heated or warmed to a suitable temperature for use.

Preferably, the thus obtained thin-film semiconductor substrate has the minimum possible thickness that ensures a sufficient energy conversion efficiency, for example a thickness of about 5 to 50 $\mu$m, more preferable around 30 $\mu$m.

In the present invention, before the semiconductor substrate having the electrode(s) formed on the first surface thereof is attached to the support substrate, a protective film, a film having an optical function, an insulating film and/or the like may be optionally formed.

Further, before the semiconductor substrate having the electrode(s) formed thereon is attached to the support substrate, an interconnector which connects to the electrode (s) may be formed. The interconnector may be used for drawing the electrode formed on the semiconductor substrate to the outside of the region of the semiconductor substrate. The interconnector may be connected in any place in any manner as long as it is electrically connected to the electrode. The interconnector may be formed of an electrically conductive material, for example, of the same material as the above-described materials for the electrodes.

According to the present invention, before the formation of the electrode(s) on the first surface of the semiconductor substrate, a stepped portion may be formed in a part of an edge of a second surface opposite to the first surface. Alternatively, after the formation of the electrode(s) on the first surface, a stepped portion may be formed in a part of an edge of the second surface. This stepped portion may be formed, for example, by the photolithography and etching process or the like. The height of the stepped portion is not particularly limited and, for example, may be equal to or larger than, preferably about twice as large as, the thickness of the solar cell after the semiconductor substrate is processed into the thin-film semiconductor substrate.

In the case of forming the above-described stepped portion, the electrode(s) formed before or after the formation of the stepped portion is(are) preferably formed to extend from a region of the first surface corresponding to a region of the second surface in which region the stepped portion does not exist/is not to exist to a region of the first surface corresponding a region of the second surface in which region the stepped portion is formed/is to be formed.

When the semiconductor substrate with the above-described stepped portion formed thereon, after attached to the support substrate, is polished or etched into the thin-film semiconductor substrate, the semiconductor substrate at the stepped portion is removed sooner than the semiconductor substrate in a region where the stepped portion does not exist. Alternatively, when the semiconductor substrate is processed, the semiconductor substrate may be partially removed at the stepped portion. Consequently, a part of the electrode lying under the stepped portion becomes exposed. Thereby, even in the case where the electrode-bearing surface of the semiconductor electrode is attached to the support substrate, electrical contact with the electrode can be easily made.

According to the present invention, in the step of attaching the semiconductor substrate to the support substrate, sides of the semiconductor substrate and edges of the surface thereof may be covered with a resin based adhesive used for attachment.

Generally, when a semiconductor substrate attached to a support substrate is etched into a thin-film semiconductor substrate, specific sites such as corners of the semiconductor substrate are sometimes over-etched because the etching rate is higher in the specific sites than in other sites of the semiconductor substrate. Also, even in the case of isotropic etching, edges of the semiconductor substrate, if exposed, are etched not only in a direction of the thickness of the semiconductor substrate but also in a direction parallel to the surface of the semiconductor substrate. As a result, the area of the semiconductor substrate becomes smaller than the area of the semiconductor substrate before etched. In such a case, the semiconductor substrate may not have an effective thickness for photoelectric conversion with reliability, or the photo-receptive area of the solar cell may not be ensured. Consequently, the properties of the solar cell are likely to deteriorate.

In contrast, according to the present invention, the semiconductor substrate can be prevented from being etched along its edges, because of the coverage of the sides of the semiconductor substrate and the edges of the surface thereof with the adhesive. Therefore, a proper thickness and area can be ensured in the entire region of the semiconductor substrate.

In the present invention, the semiconductor substrate may be for constructing one unit solar cell or may be for constructing a plurality of unit solar cells.

In the case where the semiconductor substrate is for constructing one unit solar cell, the support substrate may be separated to the size of the semiconductor substrate, thereby to from a unit solar cell. Alternatively, a support substrate having a size fit to the size of the unit solar cell may be used, and the unit solar cell may be completed without dividing the support substrate.

In the case where the semiconductor substrate is for constructing a plurality of unit solar cells, the support substrate may be divided together with the semiconductor substrate attached thereto, thereby to form a plurality of separate support substrates which may have one unit solar cell or a plurality of unit solar cells thereon.

In the case where one or a plurality of semiconductor substrate(s) each constructing one unit solar cell or a plurality of unit solar cells is/are placed on and attached to the support substrate, the resulting solar cells may be connected on the support substrate which is not divided.

Further, in the present invention, after the semiconductor substrate attached to the support substrate is processed into the thin-film semiconductor substrate, the surface of the thin-film semiconductor substrate may optionally be patterned to have pyramid-shaped projections and depressions; a diffusion layer and an electrode may optionally be formed on the surface of the thin-film semiconductor substrate; or a protective film and/or an insulating film may optionally be formed thereon.

EXAMPLES

The process for producing a solar cell of the present invention and the solar cell produced thereby are now explained in further detail with reference to the accompanying figures.

Example 1

Figure 1B:
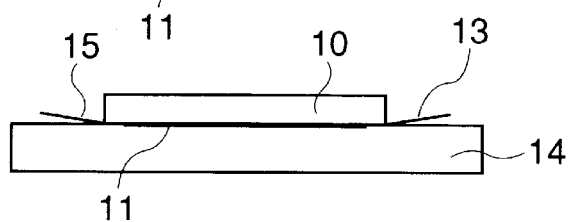
Figure 1C:
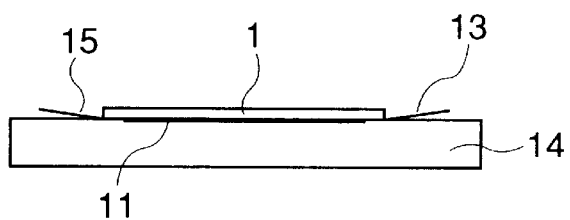
Figure 2A:
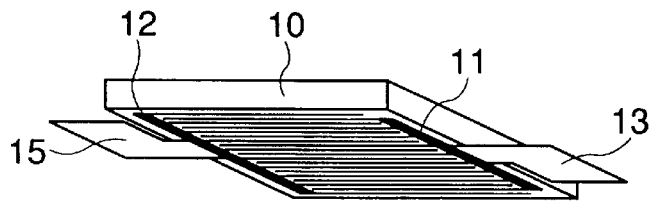
FIGS. 2(a) to 2(c) are bottom perspective views illustrating the process, these figures corresponding to FIGS. 1(a) to 1(c)
Figure 2B:
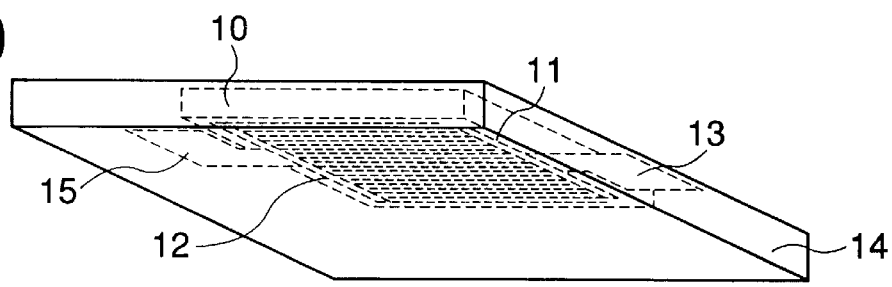
Figure 2C:
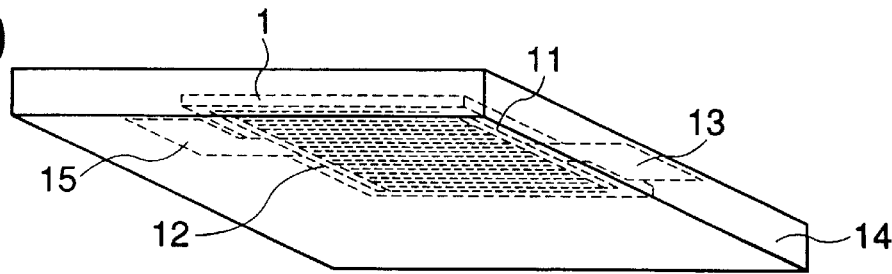

Referring to FIGS. 1(*a*) and 2(*a*), a single-crystal silicon substrate 10 of 100 $\mu$m thickness is used. On one surface of the silicon substrate 10, that is, on a non-photo-receptive face, a p-type diffusion layer (not shown) and an n-type diffusion layer (not shown) are formed like islands by the following process.

Layers to be masks in a diffusion step are formed of a silicon oxide film or the like on both faces of the substrate by CVD. The layer on the non-photo-receptive face is patterned in a desired configuration by photolithography and etching process to form a masking layer. Using this masking layer, the substrate is heated to about 900° C. in an oven for diffusion into which $BBr_5$ and oxygen are introduced, thereby to form a boron silica glass film and at the same time to form an island-like p-type diffusion layer by solid-phase diffusion of boron through the boron silica glass. In a similar manner using $POCl_5$ and oxygen, an island-like n-type diffusion layer is formed.

Subsequently, an excess insulating film existing on the surface of the silicon substrate 10 on which surface the p-type and n-type diffusion layers have been formed is removed. Thereafter, a p-electrode 12 and an n-electrode 11 of Ag/Pd/Ti are separately formed to connect to the p-type and n-type diffusion layers, respectively. Then the p-electrode 12 and n-electrode 11 are welded to interconnectors 15 and 13 of silver which serves as extraction electrodes.

Next, as shown in FIGS. 1(*b*) and 2(*b*), the surface on which the p-electrode 12 and the n-electrode 11 have been formed is attached to a support substrate 14 of glass by means of, for example, a silicone resin based adhesive.

Thereafter, as shown in FIGS. 1(*c*) and 2(*c*), the single-crystal silicon substrate 10 attached to the support substrate 14 is processed into a thin-film silicon substrate 1 of about 30 $\mu$m thickness. This process is carried out by heating a 50% aqueous solution of NaOH to 100° C. and immersing the support substrate 14 to which the single-crystal silicon substrate 10 has been attached, in the heated aqueous solution for about 10 minutes. The silicone resin based adhesive and the interconnectors of silver are relatively insusceptible to the etching effect of aqueous solutions of NaOH.

Subsequently, pyramid-shaped projections and depressions (not shown) are formed on a surface of a cell to be a photo-receptive surface by etching with a diluent aqueous KOH solution of several %. After sufficient rinsing, an anti-reflection film (not shown) of $TiO_2/Al_2O_3$ is deposited on the entire photo-receptive face by vapor deposition.

A solar cell is completed by the above-described process.

According to this process, since the diffusion layers and the electrodes are formed on the single-crystal silicon substrate which is still thick before processed into the thin film, the breaking of the silicon substrate during the production process is avoided. Further, since the single-crystal silicon substrate is made into the thin film substrate after attached to the support substrate, a very thin silicon substrate is obtained in the completed cell.

Example 2

Figure 3A:
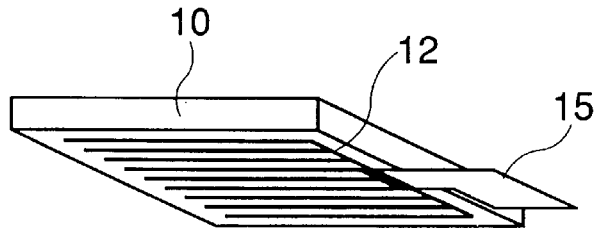
FIGS. 3(a) to 3(c) are bottom perspective views of a solar cell, illustrating another process for producing a solar cell in accordance with the present invention.
Figure 3B:
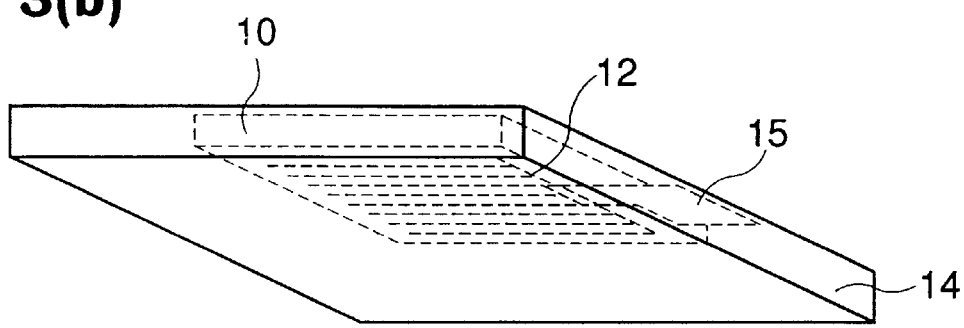
Figure 3C:
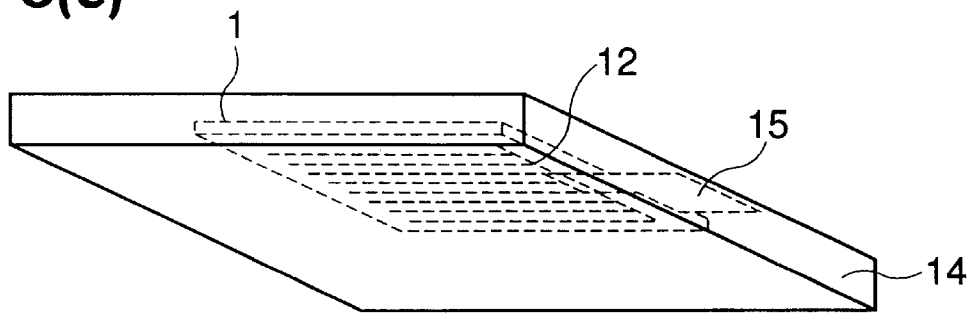

Referring to FIG. 3(*a*), a single-crystal silicon substrate 10 of 100 $\mu$m thickness is used. On one surface of the silicon substrate 10, that is, on a non-photo-receptive face, a p-type diffusion layer (not shown) is formed like an island in the same manner as in Example 1.

Subsequently, an excess insulating film existing on the surface of the single-crystal silicon substrate 10 on which surface the p-type diffusion layer has been formed is removed. Then a p-electrode 12 of Ag/Pd/Ti is formed to connect to the p-type diffusion layer. Next, an interconnector 15 of silver which servers as an extraction electrode is welded to the p-electrode 12. The surface on which the p-electrode 12 has been formed is attached to a support substrate 14 of glass by means of, for example, a silicone resin based adhesive.

Thereafter, the single-crystal silicon substrate 10 attached to the support substrate 14 is processed into a thin-film silicon substrate 1 of about 30 μm thickness. This process is carried out by heating a 50% aqueous solution of NaOH to 100° C. and immersing the support substrate 14 to which the single-crystal silicon substrate 10 has been attached, in the heated aqueous solution for about 10 minutes. The silicone resin based adhesive and the interconnectors of silver are relatively insusceptible to the etching effect of aqueous solutions of NaOH.

Subsequently, pyramid-shaped projections and depressions (not shown) are formed on a surface of a cell to be a photo-receptive surface by etching with a diluent aqueous KOH solution of several %. After sufficient rinsing, an n-type silicon microcrystal layer (not shown) is deposited on the entire photo-receptive face by CVD.

Further, an n-electrode (not shown) of Ag/Pd/Ti is formed in the shape of a comb on the photo-receptive face, and then an anti-reflection film (not shown) of $TiO_2/Al_2O_3$ is deposited thereon.

A solar cell is completed by the above-described process.

According to this process, since the diffusion layer and the electrode are formed on the single-crystal silicon substrate which is still thick, the breaking of the silicon substrate during the production process is avoided. Further, since the single-crystal silicon substrate is made into a thin film after the silicon substrate is attached to the support substrate, a very thin silicon substrate is obtained in the completed cell.

Example 3

Figure 4A:
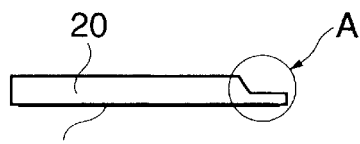
FIGS. 4(a) to 4(c) are schematic sectional views of a major part of a solar cell, illustrating still another process for producing a solar cell in accordance with the present invention.
Figure 5A:
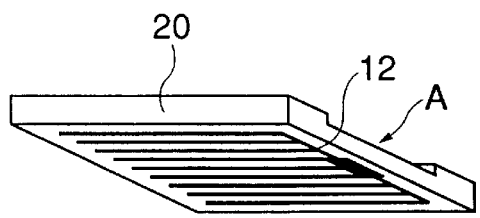
FIGS. 5(a) to 5(c) are bottom perspective views illustrating the process, these figures corresponding to FIGS. 4(a) to 4(c)

Referring to FIGS. 4(a) and 5(a), a single-crystal silicon substrate 20 of 100 μm thickness is used. Then, a stepped portion A of about 60 μm depth is formed on one side of the single-crystal silicon substrate 20. The stepped portion A is formed on a surface of the silicon substrate 20 opposite to a surface thereof which is to be attached to a support substrate later, by forming a thermally oxidized film on the entire surface of the single-crystal silicon substrate 20, forming an opening in the thermally oxidized film by photolithography and etching, and then etching the silicon substrate 20 with an aqueous alkali solution using as a mask the thermally oxidized film having the opening. On the other surface of the silicon substrate 20, that is, on a non-photo-receptive face, a p-type diffusion layer (not shown) and a p-electrode 12 are formed in the same manner as in Example 2.

Figure 4B:
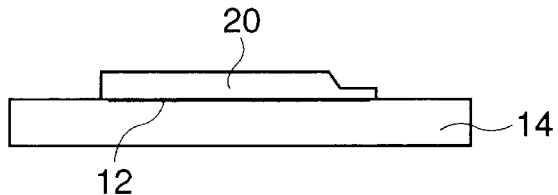
Figure 5B:
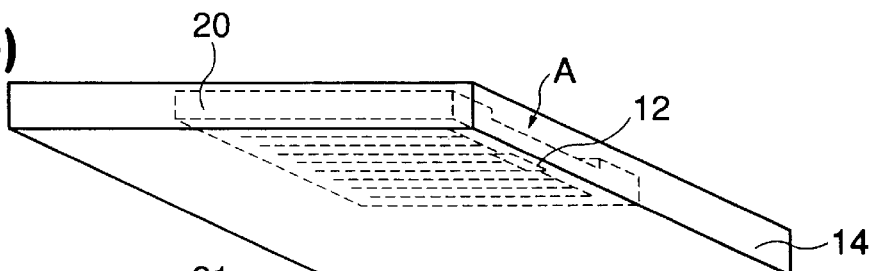

Thereafter, as shown in FIGS. 4(b) and 5(b), the surface of the resulting single-crystal silicon substrate 20 on which surface the p-electrode 12 has been formed is attached to the support substrate 14 in the same manner as in Example 2.

Figure 4C:
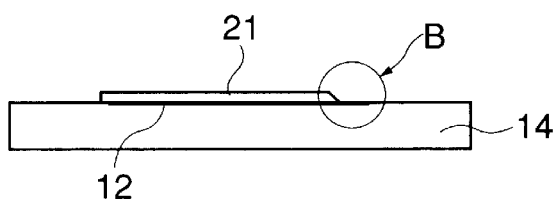
Figure 5C:
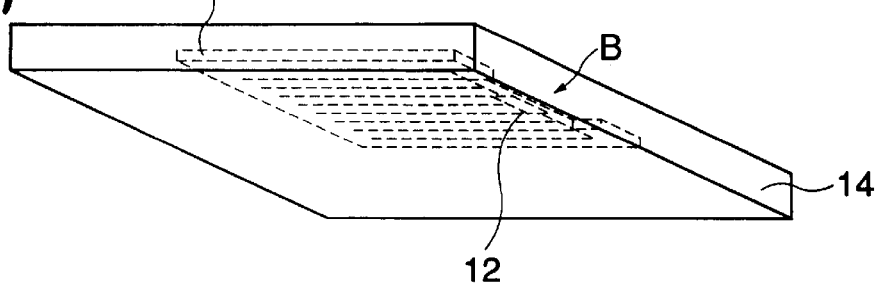

Subsequently, as shown in FIGS. 4(c) and 5(c), the single-crystal silicon substrate 20 attached to the support substrate 14 is processed into a thin-film silicon substrate 21 of about 30 μm thickness, as in Example 2. At this stage, the etching of the single-crystal silicon substrate 20 also proceeds at the stepped portion A, where the single-crystal silicon substrate 20 is completely removed by etching, so that a part of the p-electrode 12 which has been formed at the bottom of the single-crystal silicon substrate 20 (see FIGS. 4(c) and 5(c)) is exposed.

Thereafter, a solar cell is completed by conducting the same process as described in Example 2.

According to this process, as in Examples 1 and 2, the breaking of the silicon substrate during the production process is avoided and also a very thin silicon substrate is obtained in the completed solar cell.

Furthermore, by providing the stepped portion, it is possible to omit the step of forming an interconnector for the p-electrode formed on the non-photo-receptive face.

Example 4

Referring to FIGS. 6(a) and 7(a), used is a single-crystal silicon substrate 20 of 100 μm thickness which has a stepped portion of 60 μm depth on one of its sides. On one surface of the silicon substrate 20, that is, on a non-photo-receptive face, a p-type diffusion layer (not shown) and a p-electrode 12 are formed in the same manner as in Example 2.

Thereafter, as shown in FIGS. 6(b) and 7(b), the surface of the resulting single-crystal substrate 20 on which the p-electrode 12 has been formed is attached to a support substrate 14.

Attachment here is performed using as an adhesive a two-pack type silicone resin typified by DC-98-500 manufactured by Dau Coning, for example. A main agent and a curing agent of this adhesive are mixed in a proportion of about 10:1 and then applied onto the support substrate, on which the silicon substrate to form a solar cell are placed and pressed so that the adhesive spreads all over the surface of the silicon substrate. Thereafter, the adhesive is defoamed in vacuum at about several Torrs. The adhesive forced out around the silicon substrate is removed, and then the silicon substrate is incubated in an oven at about 100° C. for about an hour in order that the adhesive cures.

Subsequently, as shown in FIGS. 6(c) and 7(c), the single-crystal silicon substrate 20 attached to the support substrate 14 is processed into a thin-film silicon substrate 21 of about 30 μm thickness in the same manner as in Example 2. Here, by using an adhesive which is resistant to a liquid for etching in this thin-film processing, the penetration of the etching liquid from the periphery of the silicon substrate is prevented, and therefore a uniform thin-film processing is performed.

Thereafter, a solar cell is completed by the same process as in Example 2.

According to this process, the breaking of the silicon substrate during the production process is avoided and also a very thin silicon substrate is obtained in the completed solar cell, as in Examples 1 and 2.

Further, because of the use of the two-pack type silicone resin as an adhesive, it is possible to obtain a stable shape and stable properties for the solar cell, in spite of a number of potentially damaging steps in the production process. Also by setting a relatively high temperature and a relatively long curing time for curing the adhesive in the oven, a more stable resistance is ensured even against an etching liquid of increased concentration. Furthermore, since the adhesive used is easy to degas in vacuum at a high temperature, the adhesive does not change its shape and properties even if exposed to a high temperature in vacuum in a later step of forming a metal film for an electrode or the like. Accordingly, in outer space where the solar cell is used, the cell is free from problems due to changes of the properties of the adhesive caused by the generation of gas and/or radiation of cosmic rays, and therefore the cell maintains its properties.

Example 5

Figure 8A:
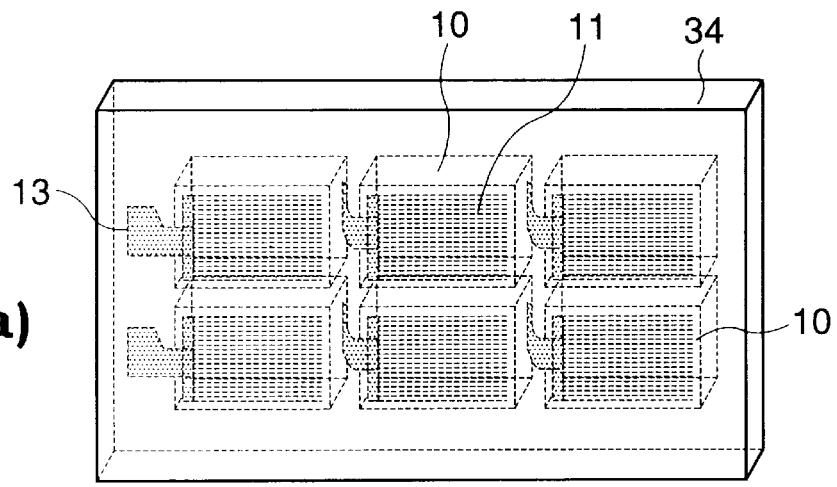
FIGS. 8(a) to 8(d) are schematic perspective views of major parts of solar cells, illustrating still another process for producing solar cells in accordance with the present invention.

Referring to FIG. 8(a), a single-crystal silicon substrate 10 of 100 μm thickness is used. On one surface of the single-crystal silicon substrate 10, that is, on a photo-receptive face, an n-type diffusion layer (not shown) is formed like an island using a resist film having an opening of a desired configuration, in the same manner as in Example 1. Then, removed is an excess insulating film existing on the surface on which the n-type diffusion layer has been formed, and an n-electrode 11 of Ag/Pd/Ti is formed to connect to the n-type diffusion layer. Further, an anti-reflection film (not shown) of $TiO_2/Al_2O_3$ is deposited on the entire photo-receptive face.

Subsequently, an interconnector 13 of silver as an extraction electrode is welded to the n-electrode 11. Thereafter, the photo-receptive face of the silicon substrate 10 on which the n-electrode 11 has been formed is attached to a support substrate 34 which is comprised of a cover glass with an anti-reflection film for a solar cell. Here a number of silicon substrates 10 having n-electrodes 11 formed thereon are attached to the support substrate 34. Attachment is performed with a silicone resin based adhesive.

Figure 8B:
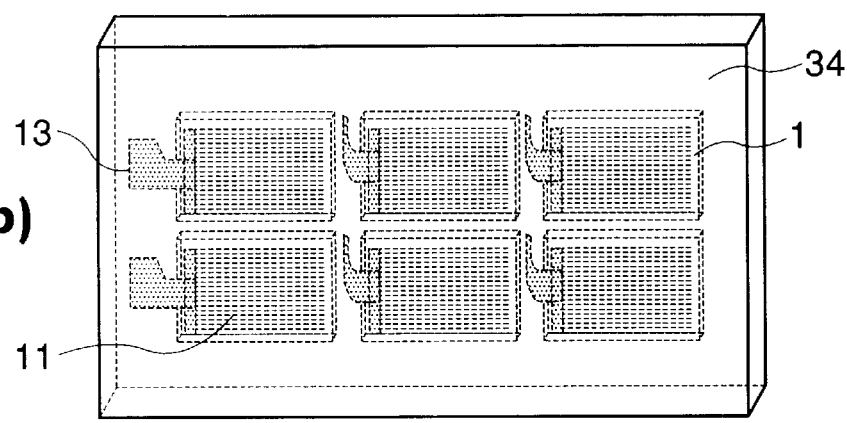

Then, as shown in FIG. 8(b), the single-crystal silicon substrates 10 attached to the support substrate 34 are processed into thin-film silicon substrates in the same manner as in Example 1.

Subsequently, on the non-photo-receptive faces of the thin-film silicon substrates 1, p-type silicon microcrystal layers (not shown) are deposited by CVD, and p-electrodes (not shown) of Ag/Pd/Ti are formed on the silicon microcrystal layers.

Figure 8C:
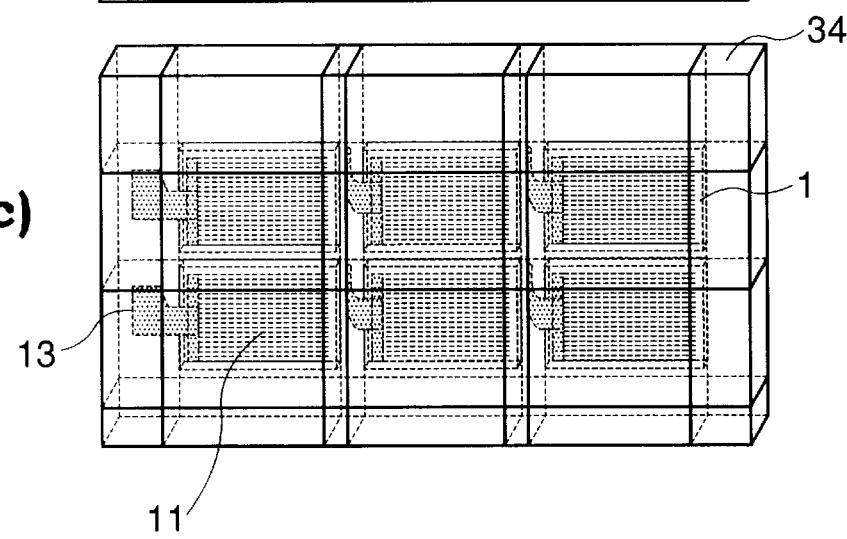
Figure 8D:
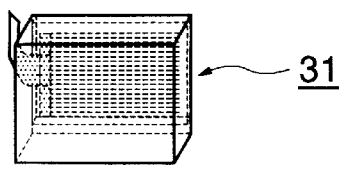

Lastly, as shown in FIG. 8(c), the support substrate 34 having these several silicon substrates 1 attached thereto is divided into separate cells with a blade rotating at a high speed, for example, by use of a dicing technique which is generally used in an IC field, thereby to obtain a number of unit solar cells 31, each one of which is such as shown in FIG. 8(d). At this step, alignment is made using as a guide patterns generated on the silicon substrates (solar cells) attached to the support substrate.

Example 6

Figure 9A:
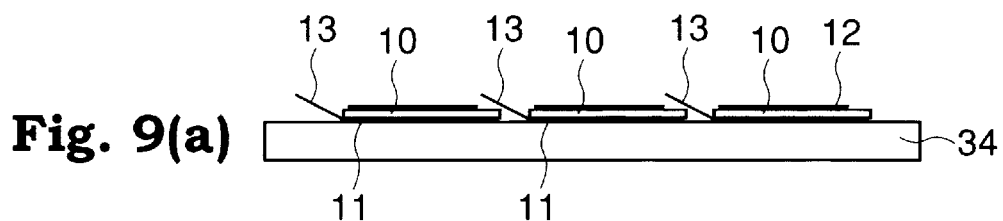
FIGS. 9(a) to 9(b) are schematic sectional views of major parts of solar cells, illustrating another process for producing solar cells in accordance with the present invention.
Figure 9B:
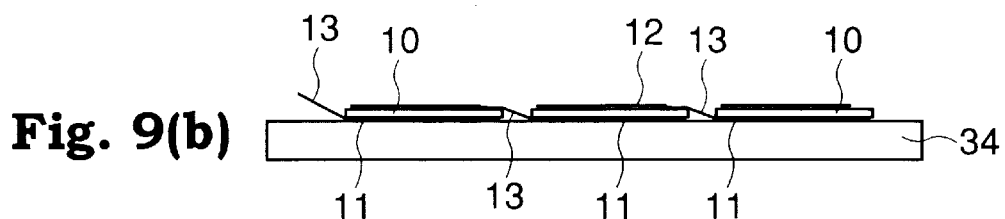
Figure 10A:
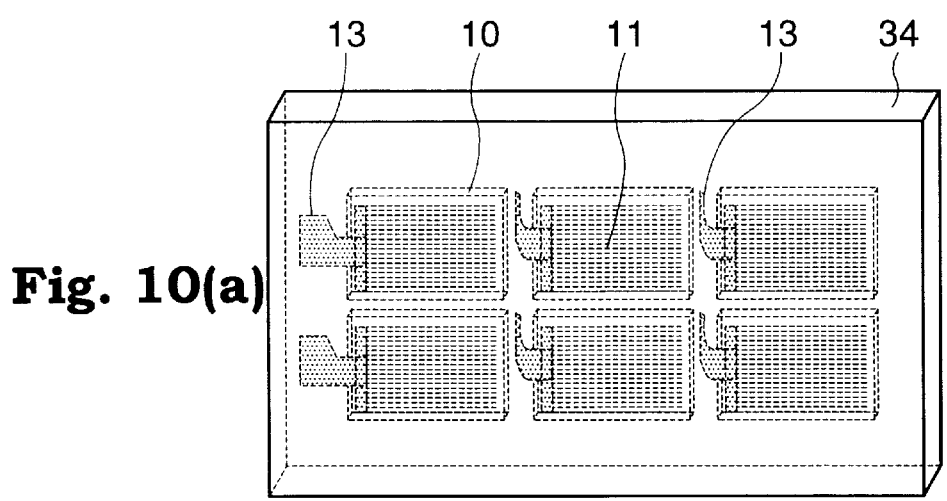
FIGS. 10(a) to 10(b) are bottom perspective views illustrating the process, these figures corresponding to FIGS. 9(a) to 9(b)
Figure 10B:
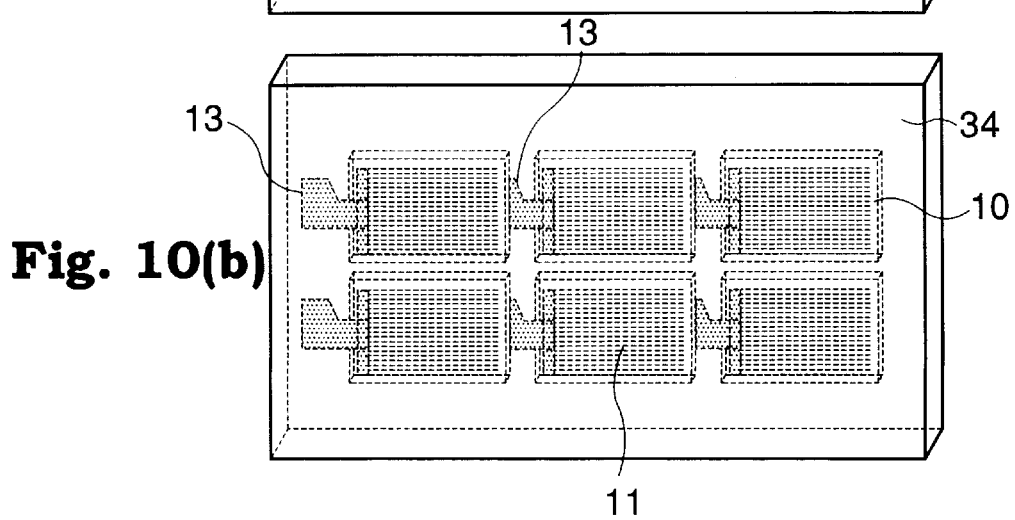

As shown in FIGS. 9(a) and 10(a), a support substrate 34 is produced which has a number of thin-film silicon substrates 1 attached thereto, the thin-film silicon substrates each provided with an n-type diffusion layer, an n-electrode 11 and an interconnector 13 on its photo-receptive face and a p-type silicon microcrystal layer and a p-electrode 12 on its non-photo-receptive face.

In order to use the thin-film silicon substrates 1 thus formed without separating them into the individual cells, the interconnectors 13 drawn from the n-electrodes 11 are welded to the p-electrodes 12 formed on surfaces of adjacent thin-film silicon substrates 1, thereby to connect the plural solar cells in series which form a solar cell module.

Example 7

Figure 11A:
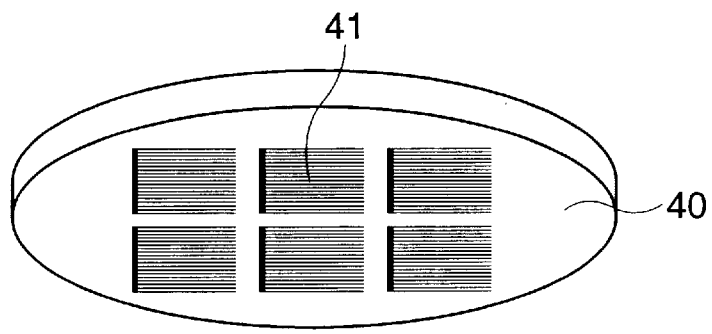
FIGS. 11(a) to 11(e) are schematic perspective views of major parts of solar cells, illustrating still another process for producing solar cells in accordance with the present invention.

As shown in FIG. 11(a), used is a silicon substrate 40 in the form of a wafer of 100 μm thickness which is cut out from an ingot of single-crystal silicon. On a photo-receptive face of the silicon substrate 40, n-type diffusion layers and n-electrodes 41 are formed using the same process as described in Example 5.

Figure 11B:
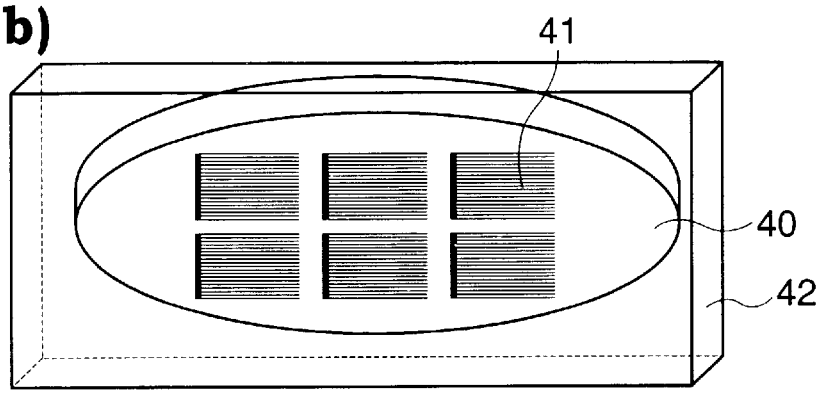

Thereafter, as shown in FIG. 11(b), the surface of the silicon substrate 40 on which the n-electrodes 41 have been formed is attached to a support substrate 42 of glass in the same manner as in Example 2.

Figure 11C:
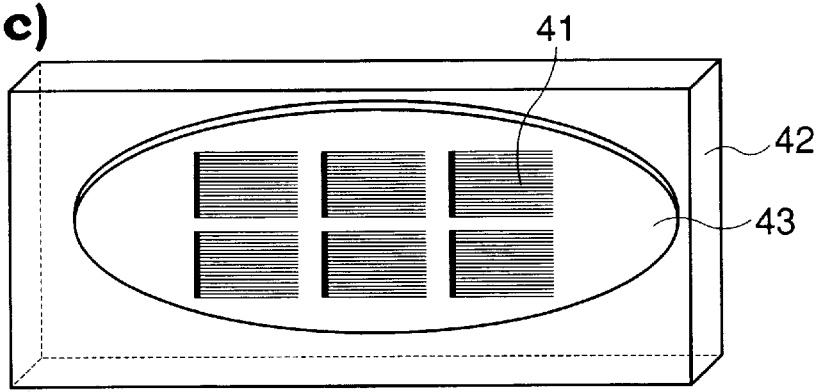

Next, as shown in FIG. 11(c), the silicon substrate 40 is processed into a thin-film silicon substrate 43 in the same manner as in Example 2.

Subsequently, p-electrodes are formed in the same manner as in Example 5.

Figure 11D:
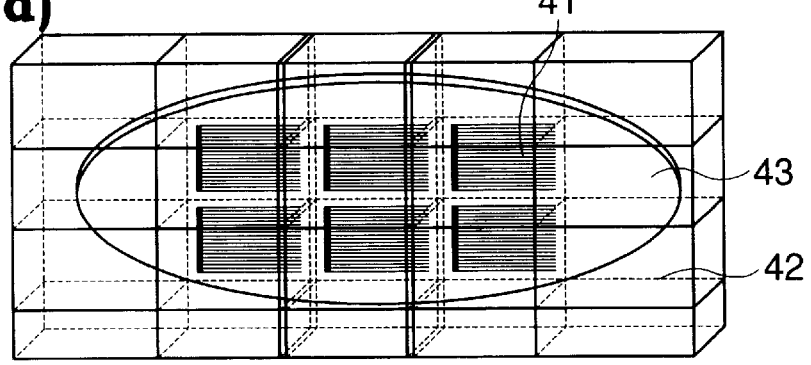
Figure 11E:
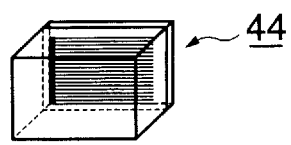
Figure 12A:
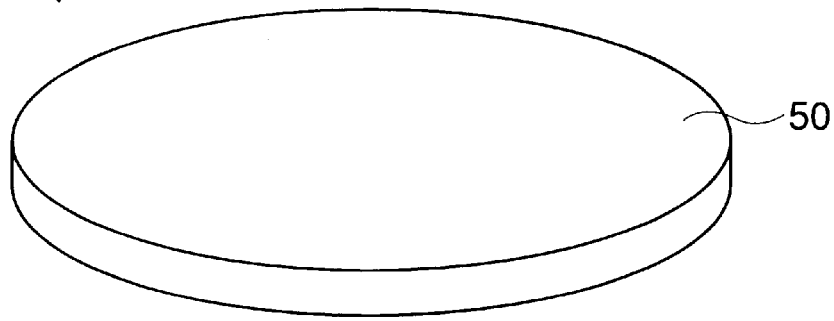
FIGS. 12(a) to 12(d) are schematic perspective views of major parts of solar cells, illustrating a conventional process for producing solar cells.
Figure 12B:
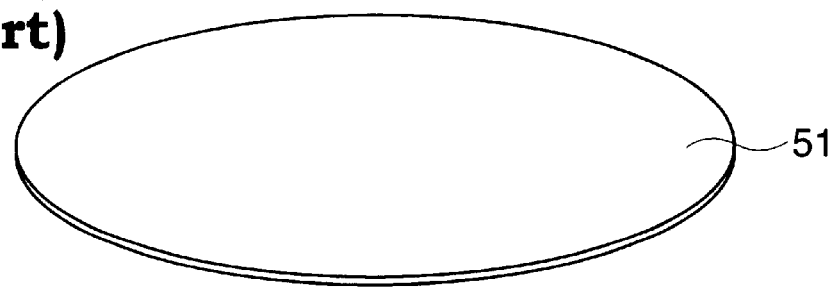
Figure 12C:
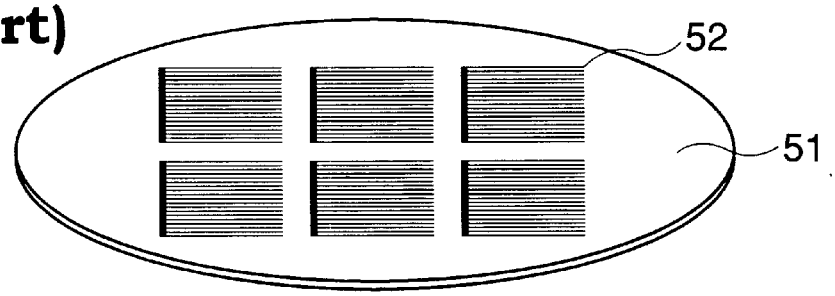
Figure 12D:
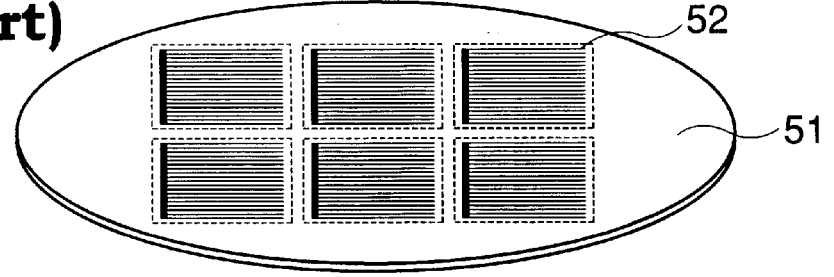
Figure 13A:
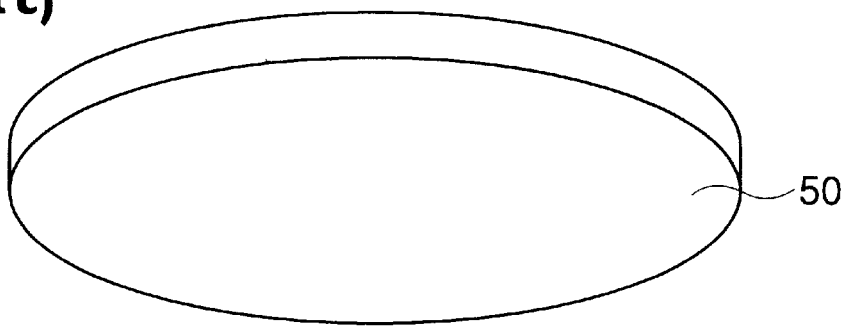
FIGS. 13(a) to 13(d) are schematic bottom perspective views of major parts of solar cells, illustrating another conventional process for producing solar cells.
Figure 13B:
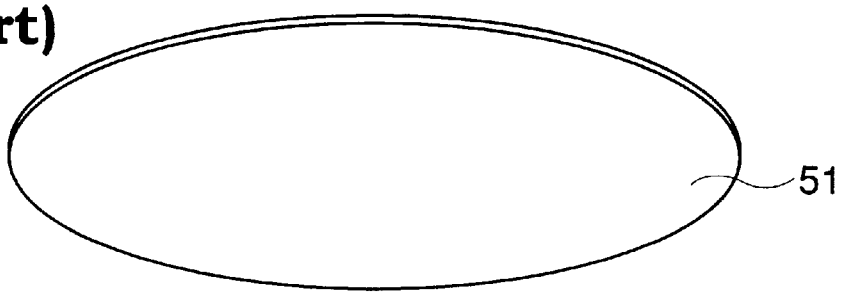
Figure 13C:
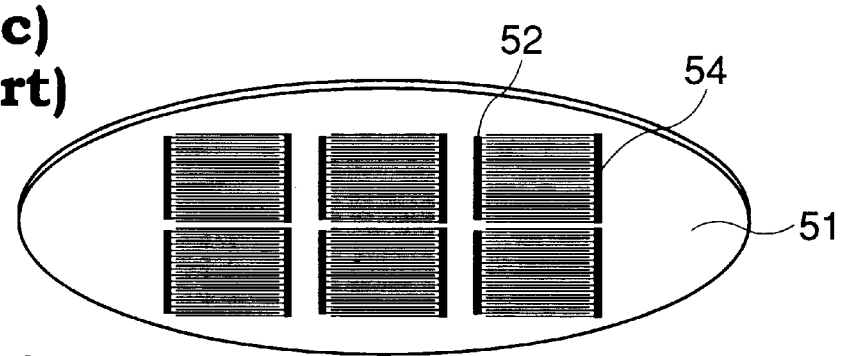
Figure 13D:
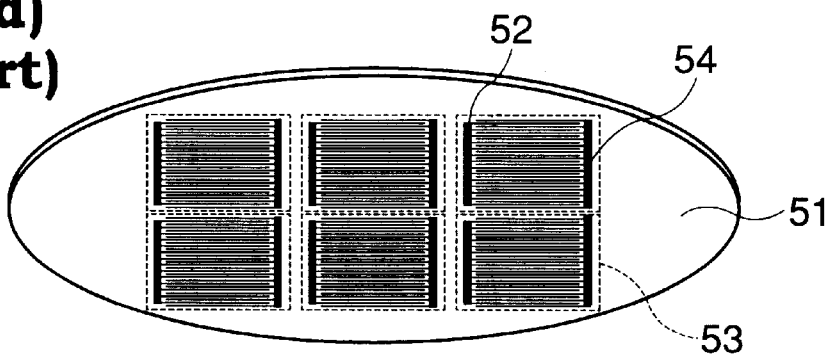

Lastly, as shown in FIG. 11(d), the thin-film silicon substrate 43 with the n-electrodes 41 and p-electrodes formed thereon is divided together with the support substrate 42 into separate cells, thereby to obtain a number of unit solar cells 44, each one of which is such as shown in FIG. 11(e).

According to the present invention, since the semiconductor substrate for constructing a solar cell is processed into the thin-film silicon substrate after attached to the support substrate, a solar cell whose substrate is far thinner than that of the conventional solar cell now can be realized. Therefore, it has become possible to produce a solar cell, especially a space-use solar cell, which has an excellent radiation resistance, without any particular attention to the handling of the semiconductor substrate, just as the conventional process.

What is claimed is:

1. A process for producing a solar cell comprising the steps of:

forming at least one electrode on a first surface of a semiconductor substrate for constructing a solar cell, attaching a support substrate to the first surface of the semiconductor substrate on which said electrode is formed, and then processing the semiconductor substrate into a thin-film semiconductor substrate so that the semiconductor substrate is made thinner after being attached to the support substrate.

2. A process according to claim 1, wherein said electrode comprises a p-electrode and an n-electrode and the first surface of the semiconductor substrate is a non-light-receptive face.

3. A process according to claim 1, wherein the support substrate is formed of a transparent material which functions as a cover glass for a space-use solar cell and the first surface of the semiconductor substrate is a photo-receptive face.

4. A process according to claim 1, further including:

forming a stepped portion at least at a part of an edge of a second surface of the semiconductor substrate which is different from the first surface of the semiconductor substrate, said forming a stepped portion step being performed either before or after said forming of the electrode, the electrode extends from a region on the first surface which corresponds to a region on the second surface where the stepped portion is not formed or is not to be formed, to a region on the first surface which corresponds to a region on the second surface where the stepped portion is formed or is to be formed, attaching the support substrate to the first surface of the semiconductor substrate on which the electrode is formed, and processing the semiconductor substrate into a thin-film semiconductor substrate in such a manner that the semiconductor substrate is removed at the stepped portion so as to expose a part of the electrode in the region for electrical connection.

5. A process according to claim 4, wherein the semiconductor substrate is processed into a thin-film semiconductor substrate in such a manner that the semiconductor substrate is partially removed at the stepped portion.

6. A process according to claim 1, wherein an interconnector for connection to the electrode is formed after the electrode is formed and before the support substrate is attached to the first surface of the semiconductor substrate on which the electrode is formed.

7. The process according to claim 6, wherein a plurality of semiconductor substrates each for constructing a unit solar cell or one or a plurality of semiconductor substrate(s) each for constructing a plurality of unit solar cells are attached to one support substrate and the resulting unit solar cells are electrically connected by an interconnector connected to the electrodes of the unit solar cells.

8. A process according to claim 1, wherein the support substrate is attached to the first surface of the semiconductor substrate using a resin based adhesive, and sides of the semiconductor substrate and edges of the second surface of the semiconductor substrate are covered with the resin based adhesive.

9. The process according to claim 1, further comprising the step of dividing the thin-film semiconductor substrate together with the support substrate which is attached to the thin-film semiconductor substrate, thereby to obtain one or a plurality of unit solar cell(s).

10. The process according claim 1, wherein a plurality of semiconductor substrates each for constructing a unit solar cell, or one or a plurality of semiconductor substrates each for constructing a plurality of unit solar cells are(is) attached to one support substrate, and the support substrate is divided so as to provide separate semiconductor substrates or a semiconductor substrate each forming one or a plurality of unit solar cell(s).

11. A solar cell produced by a process as set forth in claim 1.

* * * * *